US012601789B2

(12) United States Patent
Kim

(10) Patent No.: US 12,601,789 B2
(45) Date of Patent: Apr. 14, 2026

(54) METHOD AND APPARATUS FOR INSPECTING BATTERY

(71) Applicants: HYUNDAI MOTOR COMPANY, Seoul (KR); KIA CORPORATION, Seoul (KR)

(72) Inventor: Sung Ho Kim, Daejeon (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 235 days.

(21) Appl. No.: 18/533,690

(22) Filed: Dec. 8, 2023

(65) Prior Publication Data

US 2025/0060416 A1 Feb. 20, 2025

(30) Foreign Application Priority Data

Aug. 14, 2023 (KR) ........................ 10-2023-0106339

(51) Int. Cl.
G01R 31/389 (2019.01)
G01R 31/388 (2019.01)
G01R 31/396 (2019.01)

(52) U.S. Cl.
CPC ......... G01R 31/389 (2019.01); G01R 31/388 (2019.01); G01R 31/396 (2019.01)

(58) Field of Classification Search
CPC ... G01R 31/389; G01R 31/388; G01R 31/396
See application file for complete search history.

(56) References Cited

U.S. PATENT DOCUMENTS

| | | | | |
|---|---|---|---|---|
| 2002/0109506 A1* | 8/2002 | Kawakami | ........... | G01R 31/392 |
| | | | | 324/522 |
| 2004/0008031 A1* | 1/2004 | Arai | ...................... | H01M 10/48 |
| | | | | 324/429 |
| 2013/0030739 A1* | 1/2013 | Takahashi | ............ | G01R 31/392 |
| | | | | 702/63 |

* cited by examiner

*Primary Examiner* — Stephanie E Bloss
*Assistant Examiner* — Michael A Harrison
(74) *Attorney, Agent, or Firm* — MCDONNELL BOEHNEN HULBERT & BERGHOFF LLP

(57) ABSTRACT

A battery inspection method comprises charging a battery to a fully charged state, determining, when the charging is finished while the battery is in a fully charged state, deviation of an open circuit voltage (OCV) value of each of a plurality of cells included in the battery at a first time point after a preset first reference time has elapsed from a time point of finishing the charging while considering polarization voltage, and determining, according to a result of comparing the determined deviation with a preset first reference value, whether an internal short circuit has occurred in the battery on the basis of the open circuit voltage (OCV) value of each of the plurality of cells or a state of charge (SOC) of each of the plurality of cells.

18 Claims, 5 Drawing Sheets

METHOD AND APPARATUS FOR INSPECTING BATTERY

CROSS REFERENCE TO RELATED APPLICATIONS

The present application claims priority to Korean Patent Application No. 10-2023-0106339, filed Aug. 14, 2023, the entire contents of which is incorporated herein for all purposes by this reference.

BACKGROUND

Technical Field

The present disclosure relates to a battery inspection method and apparatus for diagnosing an internal short circuit of a battery cell in an unloaded state.

Background

Recently, as electrified vehicles and electric vehicles are actively developed and manufactured, vehicles equipped with batteries appear on a large scale. In addition, the cases of damage due to a fire in a vehicle equipped with a battery are increasing.

The reasons of fire in a battery are multifaceted, and in particular, a battery fire may occur due to an internal short circuit of a battery cell. Therefore, in order to prevent the battery fire, it may need to diagnose occurrence of the internal short circuit in a battery cell and take measures.

Conventionally, open circuit voltage (OCV) is calculated at a time point when a vehicle is turned off (IG OFF), such as when the battery is fully charged and the vehicle is parked, and at a time point when the vehicle is turned ON (IG ON), respectively, and a drop of the calculated open circuit voltage is calculated to diagnose an internal short circuit of a battery cell.

However, when an internal short circuit already has occurred in a battery cell, although the battery is fully charged, the charging is finished while the voltage is low compared to the voltage of the other cells, and since the difference between a drop of the open circuit voltage (OCV) between a time point of IG OFF and a time point of IG ON of a battery cell with an internal short circuit and a drop of voltage of a normal cell without an internal short circuit on the basis of characteristics of the OCV-SOC curve of the battery is insignificant, there is a problem in that it takes a long time to diagnose the internal short circuit.

The matters described above as the background art are only for improving understanding of the background of the present disclosure, and should not be taken as admitting that they correspond to the prior art already known to those skilled in the art.

SUMMARY

The present disclosure has been proposed to solve this problem, and an object of the present disclosure is to provide a battery inspection method and an apparatus therefor, which can improve a diagnosis ability of diagnosing an internal short circuit of a battery cell after a battery is fully charged.

The technical problems to be solved in the present disclosure are not limited to the technical problems mentioned above, and unmentioned other technical problems will be clearly understood by those skilled in the art from the following description.

To accomplish the object, a battery inspection method according to the present disclosure may comprise the steps of charging a battery so that the battery is in a fully charged state, determining, when the charging is finished while the battery is in a fully charged state, deviation of an open circuit voltage (OCV) value of each of a plurality of cells included in the battery at a first time point after a preset first reference time has elapsed from a time point of finishing the charging, and determining, according to a result of comparing the determined deviation with a preset first reference value, whether an internal short circuit has occurred in the battery based on the open circuit voltage (OCV) value of each of the plurality of cells or a state of charge (SOC) of each of the plurality of cells.

For example, the step of determining whether an internal short circuit has occurred may include the steps of determining, when the determined deviation is smaller than the first reference value, a drop of an open circuit voltage (OCV) of each of the plurality of cells between the first time point and a second time point after a preset second reference time has elapsed from the time point of finishing the charging, and determining whether an internal short circuit has occurred in the battery on the basis of the determined drop of the open circuit voltage (OCV).

For example, the step of determining whether an internal short circuit has occurred may include the steps of determining a difference between a drop of the open circuit voltage (OCV) in any one cell among the plurality of cells and an average value of the drop of the open circuit voltage (OCV) in remaining cells excluding the any one cell, and determining, when there is a cell of which the determined difference is equal to or greater than a preset second reference value, that an internal short circuit has occurred in the corresponding cell.

For example, the step of determining whether an internal short circuit has occurred may include the steps of determining, when the determined deviation is equal to or greater than the first reference value, a state of charge (SOC) of each of the plurality of cells at the first time point, determining a drop of a state of charge (SOC) of each of the plurality of cells between the first time point and a second time point after a preset second reference time has elapsed from the time point of finishing the charging, and determining whether an internal short circuit has occurred in the battery on the basis of the determined drop of the state of charge (SOC).

For example, the step of determining a drop may include the step of determining, in an IG ON state at the second time point, the drop of the state of charge (SOC) in each of the plurality of cells between the first time point and the second time point.

For example, the step of determining whether an internal short circuit has occurred may include the step of determining whether an internal short circuit has occurred in the battery on the basis of a difference between a drop of the state of charge (SOC) in any one cell among the plurality of cells and an average value of the drop of the state of charge (SOC) of remaining cells excluding the any one cell.

For example, the step of determining whether an internal short circuit has occurred may include the steps of increasing, when there is a cell of which the difference between the drop of the state of charge (SOC) in any one cell and the average value of the drop of the state of charge (SOC) in the remaining cells exceeds a preset third reference value, a count of the corresponding cell, and determining, when there is a cell of which the count is equal to or greater than a preset reference number of times, that an internal short circuit has occurred in the corresponding cell.

For example, the step of increasing a count may include the steps of cumulatively increasing, when the cell of which the count is increased corresponds to a cell of which the count is increased previously, the count with respect to the previous count.

For example, the step of increasing a count may include the steps of erasing, when the cell of which the count is increased does not correspond to the cell of which the count is increased previously, information on the cell of which the count is increased previously.

For example, the battery inspection method may further comprise the step of, after the step of determining whether an internal short circuit has occurred, executing, when it is determined that an internal short circuit has occurred in the cell, diagnosis logic on the plurality of cells.

In addition, to accomplish the object, a battery inspection apparatus according to the present disclosure may comprise: a charging control unit for controlling charging of a battery so that the battery is in a fully charged state, and a battery diagnosis unit for determining, when the charging is finished while the battery is in a fully charged state, deviation of an open circuit voltage (OCV) value of each of a plurality of cells included in the battery at a first time point after a preset first reference time has elapsed from a time point of finishing the charging, and determining, according to a result of comparing the determined deviation with a preset first reference value, whether an internal short circuit has occurred in the battery on the basis of the open circuit voltage (OCV) value of each of the plurality of cells or a state of charge (SOC) of each of the plurality of cells.

For example, the battery diagnosis unit may determine, when the determined deviation is smaller than the first reference value, a drop of an open circuit voltage (OCV) of each of the plurality of cells between the first time point and a second time point after a preset second reference time has elapsed from the time point of finishing the charging, and determine whether an internal short circuit has occurred in the battery on the basis of the determined drop of the open circuit voltage (OCV).

For example, the battery diagnosis unit may determine a difference between a drop of the open circuit voltage (OCV) in any one cell among the plurality of cells and an average value of the drop of the open circuit voltage (OCV) in remaining cells excluding the any one cell, and determine, when there is a cell of which the determined difference is equal to or greater than a preset second reference value, that an internal short circuit has occurred in the corresponding cell.

For example, the battery diagnosis unit may determine a state of charge (SOC) of each of the plurality of cells at the first time point when the determined deviation is equal to or greater than the first reference value, determine a drop of a state of charge (SOC) of each of the plurality of cells between the first time point and a second time point after a preset second reference time has elapsed from the time point of finishing the charging, and determine whether an internal short circuit has occurred in the battery on the basis of the determined drop of the state of charge (SOC).

For example, the battery diagnosis unit may determine a drop includes the step of determining, in an IG ON state at the second time point, the drop of the state of charge (SOC) in each of the plurality of cells between the first time point and the second time point.

For example, the battery diagnosis unit may determine whether an internal short circuit has occurred in the battery on the basis of a difference between a drop of the state of charge (SOC) in any one cell among the plurality of cells and an average value of the drop of the state of charge (SOC) of remaining cells excluding the any one cell.

For example, the battery diagnosis unit may increase, when there is a cell of which the difference between the drop of the state of charge (SOC) in any one cell and the average value of the drop of the state of charge (SOC) in the remaining cells exceeds a preset third reference value, a count of the corresponding cell, and determine, when there is a cell of which the count is equal to or greater than a preset reference number of times, that an internal short circuit has occurred in the corresponding cell.

For example, the battery diagnosis unit may increase a count includes the steps of cumulatively increasing, when the cell of which the count is increased corresponds to a cell of which the count is increased previously, the count with respect to the previous count.

For example, the battery diagnosis unit may erase, when the cell of which the count is increased does not correspond to the cell of which the count is increased previously, information on the cell of which the count is increased previously.

For example, the battery inspection apparatus may further comprise an execution unit for executing, when it is determined that an internal short circuit has occurred in the battery, diagnosis logic on the plurality of cells.

According to the present disclosure described above, the method and apparatus for inspecting a battery of the present disclosure may improve the ability of diagnosing whether an internal short circuit has occurred in the battery and enhance safety in using the battery by determining whether an internal short circuit has occurred in the battery on the basis of the state of charge (SOC) of each battery cell, when charging is finished while the battery is in a fully charged state, and deviation of the open circuit voltage (OCV) value of each of a plurality of battery cells exceeds a predetermined level after a predetermined time has elapsed from the time point of finishing the charging considering polarization voltage.

The effects that can be obtained from the present disclosure are not limited to the effects mentioned above, and unmentioned other effects will be clearly understood by those skilled in the art from the following description.

DETAILED DESCRIPTION

Figure 1:
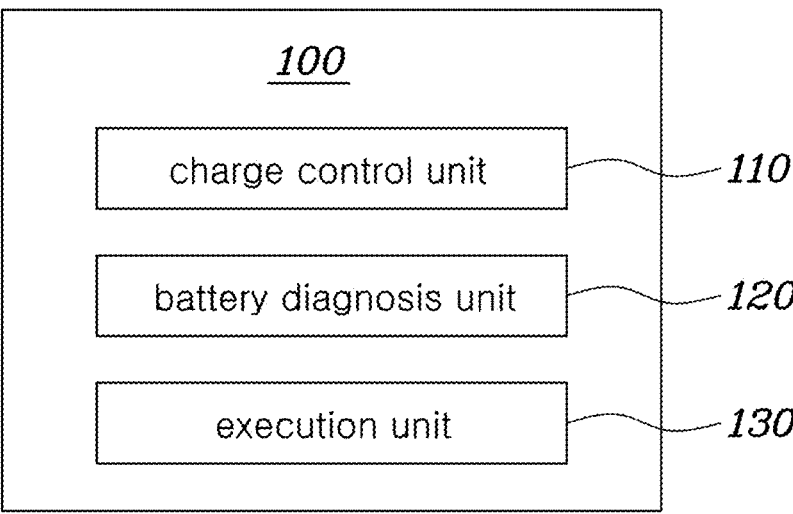
FIG. 1 is a block diagram showing the configuration of a battery inspection apparatus according to an embodiment of the present disclosure.

In describing the embodiments disclosed in this specification, when it is determined that the detailed descriptions of related known techniques may obscure the gist of the embodiments disclosed in this specification, the detailed description will be omitted. In addition, the accompanying drawings are only for easy understanding of the embodiments disclosed in this specification, and the technical spirit disclosed in this specification is not limited by the accompanying drawings, and should be understood to include all changes, equivalents, and substitutes included in the spirit and technical scope of the present disclosure.

Although terms including ordinal numbers such as first, second, and the like may be used to describe various components, the components are not limited by the terms. The terms are used only for the purpose of distinguishing one component from another.

When a component is mentioned as being "connected" or "coupled" to another component, it should be understood that although the component may be directly connected or coupled to another component, other components may exist in the middle. On the contrary, when a component is mentioned as being "directly connected" or "directly coupled" to another element, it should be understood that no other component exists in the middle.

Singular expressions include plural expressions unless the context clearly dictates otherwise.

In this specification, terms such as "comprise", "have", and the like are intended to indicate presence of a feature, number, step, operation, component, part, or combination thereof described in the specification, and it should be understood that the terms do not preclude the possibility of the presence or addition of one or more other features, numbers, steps, operations, components, parts, or combinations thereof.

Hereinafter, the embodiments disclosed in this specification will be described in detail with reference to the accompanying drawings, and the same or similar components are assigned with the same reference numerals regardless of drawing symbols, and duplicate description thereof will be omitted.

First, the configuration of a battery inspection apparatus according to an embodiment of the present disclosure will be described with reference to FIG. 1.

FIG. 1 is a block diagram showing the configuration of a battery inspection apparatus according to an embodiment of the present disclosure.

Referring to FIG. 1, a battery inspection apparatus 100 according to an embodiment of the present disclosure may include a charging control unit 110, a battery diagnosis unit 120, and an execution unit 130. FIG. 1 mainly shows components related to an embodiment of the present disclosure, and it is of course that fewer or more components may be included in implementing an actual battery inspection apparatus. Meanwhile, although the battery inspection apparatus 100 according to an embodiment of the present disclosure is described below on the assumption that it is provided in an eco-friendly vehicle (e.g., a hybrid vehicle or an electric vehicle) equipped with a battery, this is an example and not necessarily limited thereto.

Hereinafter, each component will be described.

The charging control unit 110 may control charging of a battery so that the battery may be in a fully charged state. For example, the charging control unit 110 may control charging so that the battery is in a fully charged state, and when the battery is in a fully charged state, the charging control unit 110 may transfer a signal, as soon as charging is finished, to switch to an unloaded state (IG OFF). However, this is an example and not necessarily limited thereto.

When the charging is finished while the battery is in a fully charged state, the battery diagnosis unit 120 may execute control logic to determine whether an internal short circuit has occurred in the battery.

For example, the battery diagnosis unit 120 may determine an open circuit voltage (OCV) value of each of a plurality of cells included in the battery at a first time point after a preset first reference time has elapsed from the time point when charging of the battery is finished. In addition, the battery diagnosis unit 120 may determine deviation of the open circuit voltage (OCV) value in each of the plurality of cells. At this point, the preset first reference time may mean a time that is set to completely exclude polarization voltage in an unloaded state (IG OFF), and although about 2 hours may be set for example, this is an example and is not necessarily limited to the value mentioned above.

Then, the battery diagnosis unit 120 may compare the determined deviation with a preset first reference value, and determine whether an internal short circuit has occurred in the battery on the basis of the open circuit voltage (OCV) value of each of the plurality of cells or the state of charge (SOC) of each of the plurality of cells according to a result of the comparison. At this point, the preset first reference value may mean a value that is set according to the characteristics of the OCV-SOC curve of the battery.

For example, according to the characteristics of the OCV-SOC curve of the battery, it may be divided into a region with a rapidly changing slope and a region with a gentle slope, and voltage values (open circuit voltage values) of a plurality of cells included in the battery may exist in each region. In the event of distinguishing a normal cell from an internal short-circuited cell, when voltage values (open circuit voltage values) of the normal cell and the internal short-circuited cell exist in the region where the slope changes rapidly, the normal cell and the internal short-circuited cell may be easily distinguished on the basis of the voltage values.

However, when the voltage values of the normal cell and the internal short-circuited cell are in different regions, for example, when the voltage value of the normal cell is in the region where the slope changes rapidly and the voltage value of the internal short-circuited cell is in the region with a gentle slope, although a voltage drop occurs in the internal short-circuited cell due to the internal short circuit, a voltage drop may also occur in the normal cell. For this reason, when the voltage values of the normal cell and the internal short cell exist in different regions, it is difficult to distinguish the normal cell from the internal short-circuited cell based only on the voltage values.

Therefore, in this case, it may be necessary to distinguish a normal cell from an internal short-circuited cell on the basis of a value other than the open circuit voltage. For example, the value other than the open circuit voltage may be the state of charge of the battery.

That is, the preset first reference value may be a criterion for determining whether an internal short circuit occurs in the battery, on the basis of the open circuit voltage value or the state of charge of the battery.

For example, a voltage value used as a criterion for distinguishing a region with a rapidly changing slope from a region with a gentle slope may be 4.15V according to the characteristics of the OCV-SOC curve of a battery, and when each of the normal cell and the internal short-circuited cell has a voltage value of 4.15V or higher, it is determined that they exist in the same region, and whether an internal short circuit has occurred in the battery may be determined on the basis of the open circuit voltage value.

On the other hand, when the voltage value of the normal cell is 4.18V, and the voltage value of the internal short-circuited cell is lower than 4.15V, the normal cell and the internal short-circuited cell exist in different regions, and in this case, whether an internal short circuit has occurred in the battery may be determined on the basis of the state of charge of the battery. Therefore, the first reference value may be set to, for example, 30 mV. However, this is an example and not necessarily limited thereto.

Hereinafter, a method of determining whether an internal short circuit has occurred in a battery according to a result of comparison between the determined deviation and the preset first reference value will be described in detail.

First, when the determined deviation of the open circuit voltage (OCV) value in each of the plurality of cells is smaller than the preset first reference value, the battery diagnosis unit 120 may determine a drop of the open circuit voltage (OCV) in each of a plurality of cells between a first time point and a second time point after a preset second reference time has elapsed from the time point when charging of the battery is finished. At this point, the preset second reference time may mean a time that is set to generate a drop of the state of charge (SOC) in any one battery cell due to an internal short circuit when the internal short circuit has occurred in any one battery cell, and may be set to, for example, 10 hours. However, this is an example and not necessarily limited thereto.

Then, the battery diagnosis unit 120 may determine whether an internal short circuit has occurred in the battery on the basis of the determined drop of the open circuit voltage (OCV). For example, the battery diagnosis unit 120 may determine a drop of the open circuit voltage (OCV) in any one cell among the drop of the open circuit voltage (OCV) determined for each of a plurality of cells and an average value of the drop of the open circuit voltage (OCV) in remaining cells excluding the any one cell. In addition, the battery diagnosis unit 120 may determine the difference between the drop of the open circuit voltage (OCV) in any one cell and the average value of the drop of the open circuit voltage (OCV) in the remaining cells, and compare the determined difference with a preset second reference value. When there is any one cell of which the determined difference is equal to or greater than the second reference value, the battery diagnosis unit 120 may determine that an internal short circuit has occurred in the any one cell. At this point, the preset second reference value may be a value used as a criterion for determining whether an internal short circuit has occurred or may be a value experimentally obtained. However, this is an example and not necessarily limited thereto.

Next, according to the present disclosure described above, when the determined deviation of the open circuit voltage (OCV) value in each of the plurality of cells is smaller than the preset first reference value, the battery diagnosis unit 120 determines whether an internal short circuit has occurred in the battery on the basis of the drop of the open circuit voltage (OCV) in each of the plurality of cells. However, when the determined deviation of the open circuit voltage (OCV) value in each of the plurality of cells is equal to or greater than the preset first reference value, there is no difference in the drop of the open circuit voltage (OCV) due to the characteristics of the OCV-SOC curve of the battery, and therefore, it is inappropriate to determine whether an internal short circuit has occurred in the battery, and it may take a lot of time in determining whether an internal short circuit has occurred. To solve this problem, the battery diagnosis unit 120 according to an embodiment of the present disclosure determines whether an internal short circuit has occurred in the battery on the basis of the state of charge of each of the plurality of cells when the determined deviation of the open circuit voltage (OCV) value in each of the plurality of cells is equal to or greater than the preset first reference value. This will be described with reference to FIGS. 2 and 3.

Figure 2:
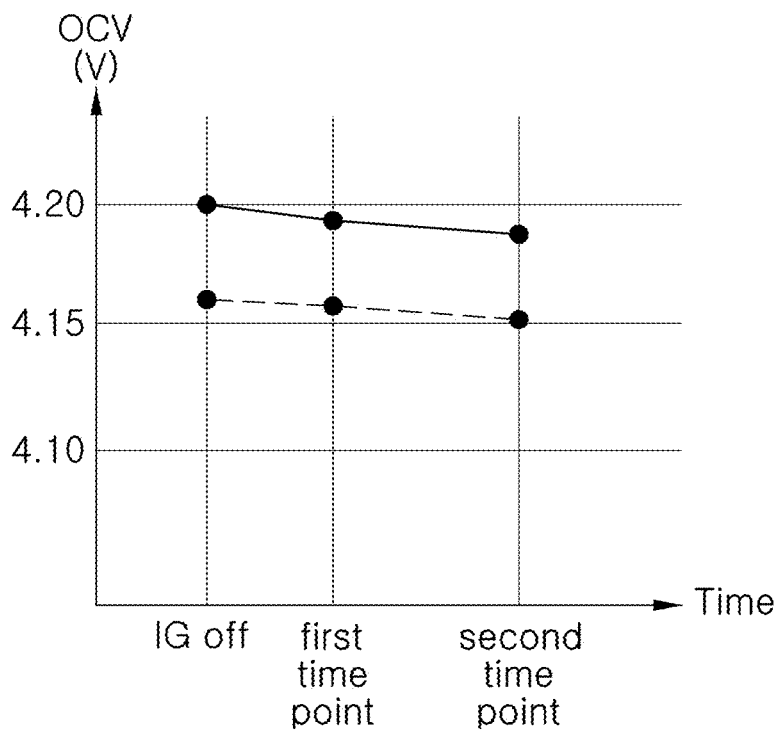
FIG. 2 is a graph showing change of the open circuit voltage (OCV) in a battery cell according to an embodiment of the present disclosure.
Figure 3:
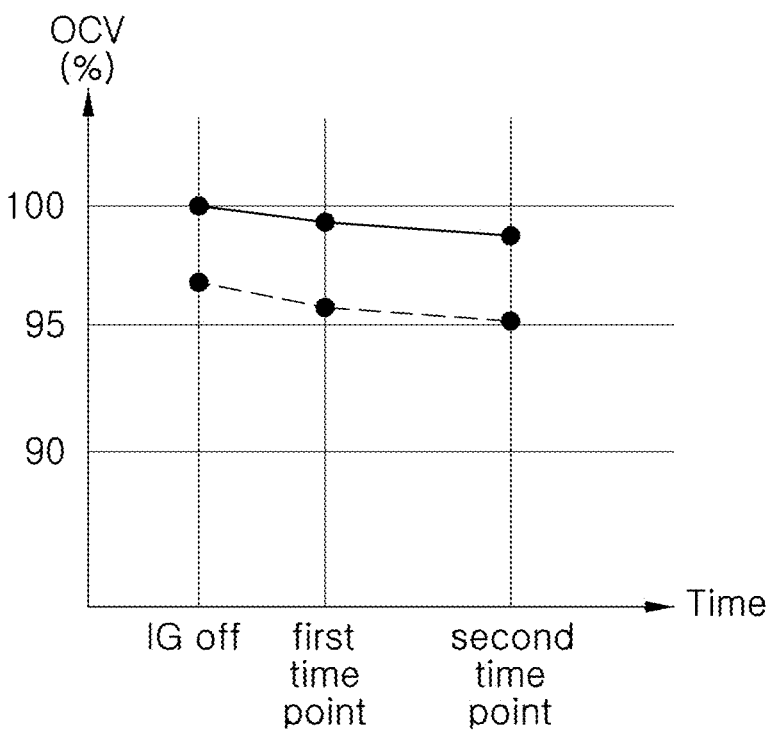
FIG. 3 is a graph showing change of the state of charge (SOC) in a battery cell according to an embodiment of the present disclosure.

FIG. 2 is a graph showing change of the open circuit voltage (OCV) in a battery cell according to an embodiment of the present disclosure, and FIG. 3 is a graph showing change of the state of charge (SOC) in a battery cell according to an embodiment of the present disclosure.

First, referring to FIG. 2, the x-axis of the graph may mean time, and the y-axis may mean the open circuit voltage (OCV) value of any one battery cell. FIG. 2 shows change of the open circuit voltage (OCV) value in any one battery cell from the time point of IG OFF when charging of the battery is completed and the charging is finished to the second time point through the first time point. The solid line shows change of the open circuit voltage (OCV) value over time when any one cell is in a normal state, and the dotted line shows change of the open circuit voltage (OCV) value over time when an internal short circuit has occurred in any one cell. Referring to FIG. 2, when the determined deviation of the open circuit voltage (OCV) value in each of the plurality of cells is equal to or greater than the preset first reference value, the pattern of change of the dotted line graph when an internal short circuit has occurred does not show a difference with respect to the pattern of change of the solid line graph in a normal state. Therefore, it is difficult to determine whether an internal short circuit has occurred in the battery based on the open circuit voltage (OCV) value. Of course, although whether an internal short circuit has occurred may be determined as a difference is shown after the second time point, since occurrence of an internal short circuit may directly lead to a battery fire and harm safety of vehicle occupants, it may be important to determine whether an internal short circuit has occurred within a short time. Therefore, the present disclosure is to determine whether an internal short circuit has occurred in the battery based on the state of charge (SOC) of each of a plurality of cells when the determined deviation of the open circuit voltage (OCV) value in each of the plurality of cells is equal to or greater than the preset first reference value.

Referring to FIG. 3, the x-axis of the graph may mean time, and the y-axis may mean the state of charge (SOC) of any one battery cell. FIG. 3 shows change of the state of charge (SOC) in any one battery cell from the time point of IG OFF when charging of the battery is completed and the charging is finished to the second time point through the first time point. The solid line shows change of the state of charge (SOC) over time when any one cell is in a normal state, and the dotted line shows change of the state of charge (SOC) over time when an internal short circuit has occurred in any one cell. Referring to FIG. 3, it can be confirmed that the pattern of change of the dotted line graph when an internal short circuit has occurred shows a difference with respect to the pattern of change of the solid line graph in a normal state. It can be confirmed that a change in the state of charge (SOC) of a cell, in which an internal short circuit has occurred compared to a normal state, is generated in the section between the time point of IG OFF and the first time point and in the section between the first time point and the second time point. Therefore, when whether an internal short circuit has occurred in a battery is determined on the basis of the state of charge (SOC) of each of the plurality of cells, whether an internal short circuit has occurred may be determined within a short time compared to the case of determining based on the open circuit voltage (OCV) value of each of a plurality of cells.

Returning to FIG. 1 again, when the determined deviation of the open circuit voltage (OCV) value in each of the plurality of cells is equal to or greater than the preset first reference value, the battery diagnosis unit 120 may determine the state of charge (SOC) of each of the plurality of cells at the first time point. Then, based on the determined state of charge (SOC), the battery diagnosis unit 120 may determine a drop of the state of charge (SOC) in each of the plurality of cells between a first time point and a second time point after a preset second reference time has elapsed from the time point when charging of the battery is finished. At this point, the battery diagnosis unit 120 may determine whether the vehicle is in an IG ON state at the second time point after the second reference time has elapsed from the time point when charging of the battery is finished, and when the IG is in an ON state, the battery diagnosis unit 120 may determine the drop of the state of charge (SOC) in each of the plurality of cells between the first time point and the second time point.

The battery diagnosis unit 120 may determine whether an internal short circuit has occurred in the battery on the basis of the determined drop of the state of charge (SOC) in each of the plurality of cells. For example, the battery diagnosis unit 120 may determine a drop of the state of charge (SOC) in any one cell among a plurality of cells and an average value of the drop of the state of charge (SOC) in the remaining cells excluding the any one cell. Then, the battery diagnosis unit 120 may determine the difference between the drop of the state of charge (SOC) in any one cell and the average value of the drop of the state of charge (SOC) in the remaining cells, and when there is any one cell of which the determined difference exceeds a preset third reference value, the battery diagnosis unit 120 may determine that an internal short circuit has occurred in the any one cell. At this point, the preset third reference value is a value that is set to determine whether an internal short circuit has occurred in the battery, and may be a value obtained experimentally. For example, the third reference value may be set to 0.3, but this is an example and not necessarily limited thereto.

Meanwhile, an error may occur in measuring the open circuit voltage (OCV) value and in determining the state of charge (SOC) of each of the plurality of cells according to the temperature in an unloaded state (IG OFF) or in an IG ON state. There is a problem in that reliability of a determination result is lowered in determining whether an internal short circuit has occurred in the battery only by determining the difference between the drop of the state of charge (SOC) in any one cell and the average value of the drop of the state of charge (SOC) in the remaining cells and determining whether the determined difference exceeds a preset third reference value without considering these errors.

Accordingly, when there is any one cell of which the determined difference exceeds a preset third reference value, the battery diagnosis unit 120 according to an embodiment of the present disclosure may increase a count for the any one cell. After the battery diagnosis unit 120 increases the count, the charging control unit 110 and the battery diagnosis unit 120 may repeatedly execute the control logic described above.

At this point, when there is any one cell of which the determined difference exceeds a preset third reference value, the battery diagnosis unit 120 may determine whether any one cell of which the count is increased corresponds to a cell of which the count is increased previously. When any one cell of which the count is increased corresponds to a cell of which the count is increased previously, the battery diagnosis unit 120 may cumulatively increase the count of the corresponding cell with respect to the previous count. However, when any one cell of which the count is increased does not correspond to the cell of which the count is increased previously, the battery diagnosis unit 120 may erase information on the cell of which the count is increased previously, and newly store any one cell of which the count is increased currently.

In addition, when there is a cell of which the count is equal to or greater than a preset reference number of times after the control logic is repeatedly executed, the battery diagnosis unit 120 may determine that an internal short circuit has occurred in the corresponding cell. Accordingly, an error that may occur in determining whether an internal short circuit has occurred due to an error occurred in measuring the open circuit voltage (OCV) value and an error occurred in determining the state of charge (SOC) can be prevented, and reliability of a result of the determination can be enhanced.

When it is determined that an internal short circuit has occurred in any one cell, the battery diagnosis unit 120 may transfer information on the occurrence of an internal short circuit and information on the cell in which an internal short circuit has occurred to the execution unit 130, and the execution unit 130 may execute diagnosis logic on a plurality of cells or any one cell. In addition, the execution unit 130 may simultaneously execute control logic as needed in order to respond to a problem such as a battery fire or the like generated due to the internal short circuit, while executing the diagnosis logic. However, this is an example and not necessarily limited thereto.

Hereinafter, a battery inspection method according to an embodiment will be described with reference to FIGS. 4 and 5 on the basis of the configuration of the battery inspection apparatus 100 described above with reference to FIG. 1.

Figure 4:
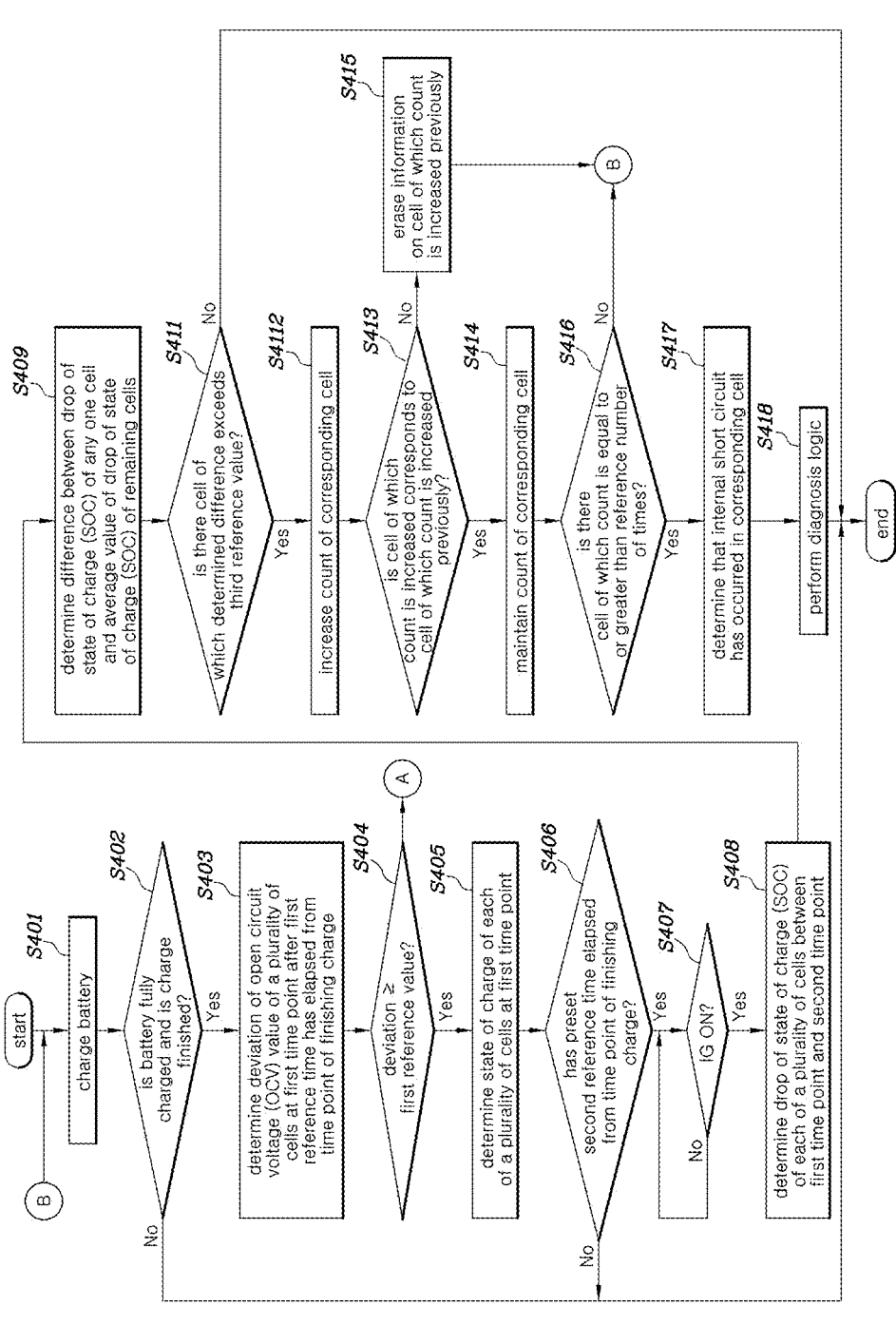
FIGS. 4 and 5 are flowcharts illustrating a battery inspection method according to an embodiment of the present disclosure.
Figure 5:
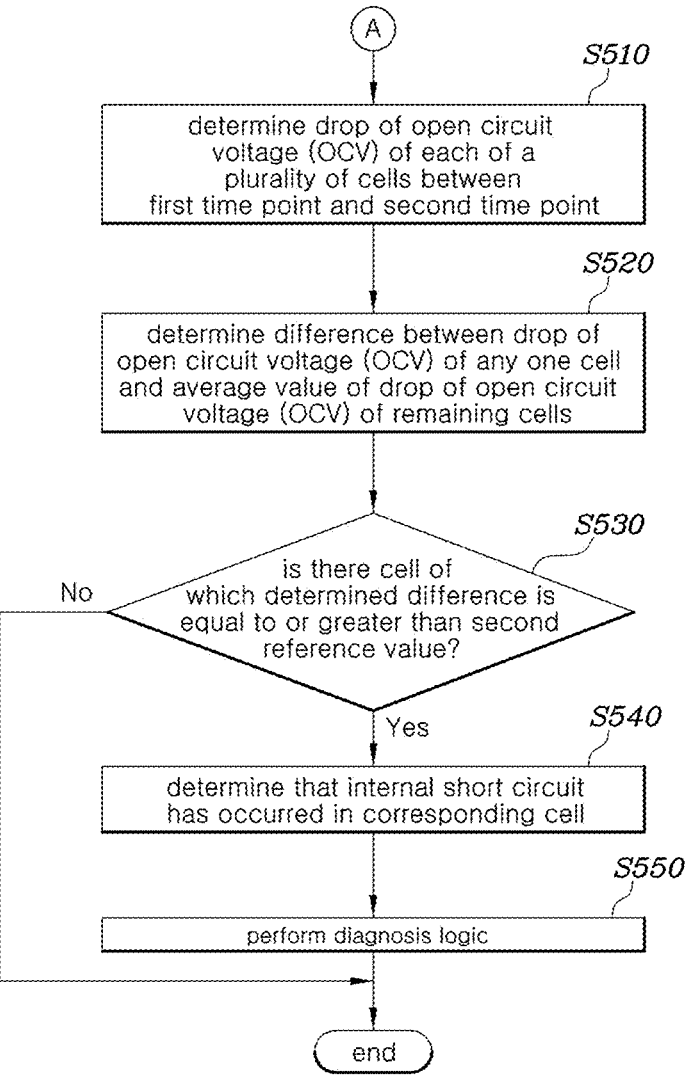

FIGS. 4 to 5 are flowcharts illustrating a battery inspection method according to an embodiment of the present disclosure.

Referring to FIG. 4, the charging control unit 110 may control the battery to be charged (S401). Then, the charging control unit 110 may determine whether the battery is in a fully charged state and control to finish the charging when the battery is in a fully charged state and transmit, at the same time, a signal to switch to an unloaded state (IG OFF).

When the battery is in a fully charged state and charging is finished (Yes of S402), the battery diagnosis unit 120 may determine deviation of the open circuit voltage (OCV) value in each of the plurality of cells included in the battery at a first time point after a preset first reference time has elapsed from the time point of finishing the charging while considering polarization voltage (S403). Then, the battery diagnosis unit 120 may compare the determined deviation with a preset first reference value (S404), and determine whether an internal short circuit has occurred in the battery on the basis of the open circuit voltage (OCV) value of each of the plurality of cells or the state of charge (SOC) of each of the plurality of cells according to a result of the comparison.

First, a case in which it is determined that the deviation determined by the battery diagnosis unit 120 is smaller than a preset first reference value (No of S404) will be described with reference to FIG. 5.

Referring to FIG. 5, when the determined deviation is smaller than a preset first reference value (No of S404), the battery diagnosis unit 120 may determine a drop of the open circuit voltage (OCV) in each of a plurality of cells between a first time point and a second time point after a preset second reference time has elapsed from the time point when charging of the battery is finished (S510). Then, the battery diagnosis unit 120 may determine the difference between the drop of the open circuit voltage (OCV) in any one cell among the plurality of cells and an average value of the drop of the open circuit voltage (OCV) in the remaining cells excluding the any one cell (S520). The battery diagnosis unit 120 may compare the determined difference with a preset second reference value and determine whether there is a cell of which the determined difference is equal to or greater than the preset second reference value (S530).

When there is a cell of which the determined difference is equal to or greater than the second reference value (Yes of S530), the battery diagnosis unit 120 may determine that an internal short circuit has occurred in the corresponding cell (S540), and transfer information on the cell in which an internal short circuit has occurred to the execution unit 130. Then, the execution unit 130 may execute diagnosis logic on the cell in which an internal short circuit has occurred or on all of the plurality of cells (S550).

Returning to FIG. 4 again, when the determined deviation is equal to or greater than the preset first reference value (Yes of S404), the battery diagnosis unit 120 may determine the state of charge (SOC) of each of the plurality of cells at a first time point (S405). Then, the battery diagnosis unit 120 may determine whether a preset second reference time has elapsed from the time point when charging of the battery is finished (S406), and when the second reference time has elapsed from the time point of finishing the charging (Yes of S406), the battery diagnosis unit 120 may confirm whether the vehicle is in an IG ON state (S407). When the vehicle is in an IG ON state (Yes of S407), the battery diagnosis unit 120 may determine a drop of the state of charge (SOC) in each of the plurality of cells between the first time point and the second time point when the second reference time has elapsed from the time point of finishing the charging (S408).

Then, the battery diagnosis unit 120 may determine the difference between the drop of the state of charge (SOC) in any one cell among the plurality of cells and an average value of the drop of the state of charge (SOC) in the remaining cells excluding the any one cell (S409). When there is a cell of which the determined difference exceeds a preset third reference value (Yes of S411), the battery diagnosis unit 120 may increase the count of the corresponding cell (S412). After the count is increased, steps S401 to S412 may be performed once again.

After the steps S401 to S412 are performed once again, the battery diagnosis unit 120 may determine whether the cell of which the count is increased corresponds to a cell of which the count is increased previously (S413), and maintain the count of the cell of which the count is increased when the cells correspond to each other (S414). However, when the cells do not correspond to each other, the battery diagnosis unit 120 may erase information on the cell of which the count is increased previously (S415). After step S415, steps S401 and thereafter may be performed again.

Then, the battery diagnosis unit 120 determines whether there is a cell of which the count is equal to or greater than a preset reference number of times (S416), and when there is a cell of which the count is equal to or greater than the preset reference number of times (Yes of S416), the battery diagnosis unit 120 may determine that an internal short circuit has occurred in the corresponding cell (S417). When there is no cell of which the count is greater than or equal to the reference number of times (No of S416), steps S401 and thereafter may be performed again.

In addition, the battery diagnosis unit 120 may transfer information on the occurrence of an internal short to the execution unit 130, and the execution unit 130 may execute diagnosis logic on the cell in which it is determined that an internal short circuit has occurred or all the plurality of cells on the basis of the transferred information (S418).

The method and apparatus for inspecting a battery according to an embodiment of the present disclosure described above may improve the ability of diagnosing whether an internal short circuit has occurred in the battery and enhance safety in using the battery by determining whether an internal short circuit has occurred in the battery on the basis of the state of charge (SOC) of each battery cell, when charging is finished while the battery is in a fully charged state, and deviation of the open circuit voltage (OCV) value of each of a plurality of battery cells exceeds a predetermined level after a predetermined time has elapsed from the time point of finishing the charging considering polarization voltage.

The present disclosure described above can be implemented as a computer-readable code on a medium on which programs are recorded. The computer-readable medium includes all types of recording devices in which data that can be read by a computer system is stored. Examples of the computer-readable media include hard disk drive (HDD), solid state disk (SSD), silicon disk drive (SDD), ROM, RAM, CD-ROM, magnetic tape, floppy disk, optical data storage device, and the like. Accordingly, the detailed description should not be construed as limiting in all respects and should be considered as illustrative. The scope of the present disclosure should be determined by reasonable interpretation of the appended claims, and all changes within the equivalent scope of the present disclosure are included in the scope of the present disclosure.

Although the present disclosure has been shown and described in relation to specific embodiments, it will be apparent to those skilled in the art that the present disclosure can be variously improved and modified without departing from the technical spirit of the present disclosure provided by the claims below.

The invention claimed is:

1. A battery inspection method comprising the steps of:

charging a battery to a fully charged state;

determining, when the charging is finished and when the battery is in a fully charged state, a deviation of an open circuit voltage (OCV) value of each of a plurality of cells included in the battery at a first time point after a preset first reference time has elapsed from a time point of finishing the charging; and determining, according to a result of comparing the determined deviation with a preset first reference value, whether an internal short circuit has occurred in the battery based on the open circuit voltage (OCV) value of each of the plurality of cells or a state of charge (SOC) of each of the plurality of cells, wherein the step of determining whether the internal short circuit has occurred further includes:

determining a change of the open circuit voltage (OCV) of each of the plurality of cells between the first time point and a second time point after a second preset reference time has elapsed from the time point of finishing the charging; and determining whether the internal short circuit has occurred in the battery based on at least one of the determined deviation or the change of the open circuit voltage (OCV).

2. The battery inspection method according to claim 1, wherein the step of determining whether the internal short circuit has occurred further includes:

determining a difference between a drop of the open circuit voltage (OCV) in any one cell among the plurality of cells and an average value of the drop of the open circuit voltage (OCV) in remaining cells of the plurality of cells excluding the any one cell; and determining, when there is a cell of which the determined difference is equal to or greater than a preset second reference value, that the internal short circuit has occurred in the cell.

3. The battery inspection method according to claim 1, wherein the step of determining whether the internal short circuit has occurred further includes:

determining, when the determined deviation is equal to or greater than the first reference value, the state of charge (SOC) of each of the plurality of cells at the first time point;

determining a drop of the state of charge (SOC) of each of the plurality of cells between the first time point and a second time point after a preset second reference time has elapsed from the time point of finishing the charging; and determining whether the internal short circuit has occurred in the battery based on the determined drop of the state of charge (SOC).

4. The battery inspection method according to claim 3, wherein the step of determining the drop further includes determining, in an IG ON state at the second time point, the drop of the state of charge (SOC) in each of the plurality of cells between the first time point and the second time point.

5. The battery inspection method according to claim 3, wherein the step of determining whether the internal short circuit has occurred further includes determining whether the internal short circuit has occurred in the battery based on a difference between a drop of the state of charge (SOC) in any one cell among the plurality of cells and an average value of the drop of the state of charge (SOC) of remaining cells of the plurality of cells excluding the any one cell.

6. The battery inspection method according to claim 5, wherein the step of determining whether the internal short circuit has occurred further includes:

increasing, when there is a cell of which the difference between the drop of the state of charge (SOC) in any one cell and the average value of the drop of the state of charge (SOC) in the remaining cells exceeds a preset third reference value, a count of the cell; and determining, when there is a cell of which the count is equal to or greater than a preset reference number of times, that the internal short circuit has occurred in the cell.

7. The battery inspection method according to claim 6, wherein the step of increasing the count includes cumulatively increasing, when the cell of which the count is increased corresponds to a cell of which the count is increased previously, the count with respect to a previous count.

8. The battery inspection method according to claim 7, wherein the step of increasing the count further includes erasing, when the cell of which the count is increased does not correspond to the cell of which the count is increased previously, information on the cell of which the count is increased previously.

9. The battery inspection method according to claim 1, further comprising the step of, after determining whether the internal short circuit has occurred, executing, when it is determined that the internal short circuit has occurred in the battery, diagnosis logic on the plurality of cells.

10. A battery inspection apparatus comprising:

a charging control unit configured to charge a battery to a fully charged state; and a battery diagnosis unit configured to:

determine, when the charging is finished while the battery is in a fully charged state, deviation of an open circuit voltage (OCV) value of each of a plurality of cells included in the battery at a first time point after a preset first reference time has elapsed from a time point of finishing the charging, and determine, according to a result of comparing the determined deviation with a preset first reference value, whether an internal short circuit has occurred in the battery based on the open circuit voltage (OCV) value of each of the plurality of cells or a state of charge (SOC) of each of the plurality of cells, wherein the battery diagnosis unit is further configured to:

determine, a change of the open circuit voltage (OCV) of each of the plurality of cells between the first time point and a second time point after a preset second reference time has elapsed from the time point of finishing the charging; and determine whether the internal short circuit has occurred in the battery based on at least one of the determined deviation or the change of the open circuit voltage (OCV).

11. The battery inspection apparatus according to claim 10, wherein the battery diagnosis unit is further configured to determine a difference between a drop of the open circuit voltage (OCV) in any one cell among the plurality of cells and an average value of the drop of the open circuit voltage (OCV) in remaining cells excluding the any one cell, and to determine, when there is a cell of which the determined difference is equal to or greater than a preset second reference value, that the internal short circuit has occurred in the cell.

12. The battery inspection apparatus according to claim 10, wherein the battery diagnosis unit is further configured to determine the state of charge (SOC) of each of the plurality of cells at the first time point when the determined deviation is equal to or greater than the first reference value, to determine a drop of the state of charge (SOC) of each of the plurality of cells between the first time point and a second time point after a preset second reference time has elapsed from the time point of finishing the charging, and to determine whether the internal short circuit has occurred in the battery based on the determined drop of the state of charge (SOC).

13. The battery inspection apparatus according to claim 12, wherein the battery diagnosis unit is further configured to determine that the drop includes determining, in an IG ON state at the second time point, the drop of the state of charge (SOC) in each of the plurality of cells between the first time point and the second time point.

14. The battery inspection apparatus according to claim 12, wherein the battery diagnosis unit is further configured to determine whether the internal short circuit has occurred in the battery based on a difference between a drop of the state of charge (SOC) in any one cell among the plurality of cells and an average value of the drop of the state of charge (SOC) of remaining plurality of cells excluding the any one cell.

15. The battery inspection apparatus according to claim 14, wherein the battery diagnosis unit is configured to increase, when there is a cell of which a difference between the drop of the state of charge (SOC) in any one cell and the average value of the drop of the state of charge (SOC) in the remaining cells exceeds a preset third reference value, a count of the corresponding cell, and to determine, when there is a cell of which the count is equal to or greater than a preset reference number of times, that the internal short circuit has occurred in the cell.

16. The battery inspection apparatus according to claim 15, wherein the battery diagnosis unit is configured to increase the count including cumulatively increasing, when the cell of which the count is increased corresponds to a cell of which the count is increased previously, the count with respect to a previous count.

17. The battery inspection apparatus according to claim 16, wherein the battery diagnosis unit is configured to erase, when the cell of which the count is increased does not correspond to the cell of which the count is increased previously, information on the cell of which the count is increased previously.

18. The battery inspection apparatus according to claim 10, further comprising an execution unit configured to execute, when it is determined that the internal short circuit has occurred in the battery, diagnosis logic on the plurality of cells.

* * * * *